United States Patent [19]

Imamura

[11] Patent Number: 5,065,221

[45] Date of Patent: Nov. 12, 1991

[54] TRIMMING RESISTOR ELEMENT FOR MICROELECTRONIC CIRCUIT

[75] Inventor: Kaoru Imamura, Kawasaki, Japan

[73] Assignee: Kabushiki Kaisha Toshiba, Kawasaki, Japan

[21] Appl. No.: 412,522

[22] Filed: Sep. 26, 1989

[30] Foreign Application Priority Data

Sep. 30, 1988 [JP] Japan .................. 63-246158

[51] Int. Cl.$^5$ .............. H01L 27/02; H01L 29/04; H01C 10/00; B23K 26/00

[52] U.S. Cl. .............................. 357/51; 357/59; 338/195; 219/121.68

[58] Field of Search ............... 357/41, 51, 59; 338/195; 219/121.68, 121.69

[56] References Cited

U.S. PATENT DOCUMENTS

| | | | |
|---|---|---|---|
| 2,261,667 | 11/1941 | Stroszeck | 201/63 |
| 3,657,692 | 4/1972 | Wormser | 338/252 |
| 4,041,440 | 8/1977 | Davis et al. | 338/195 |
| 4,217,570 | 8/1980 | Holmes | 338/195 |
| 4,228,418 | 10/1980 | Piedmont et al. | 338/195 |
| 4,283,774 | 8/1981 | Schwartz et al. | 338/195 |
| 4,301,439 | 11/1981 | Johnson et al. | 318/195 |
| 4,381,441 | 4/1983 | Desmarais et al. | 338/195 |
| 4,386,460 | 6/1983 | Klockow | 338/195 |
| 4,467,312 | 8/1984 | Komatsu | 357/51 |
| 4,906,966 | 3/1990 | Imamura et al. | 338/195 |

FOREIGN PATENT DOCUMENTS

| | | |
|---|---|---|
| 324407 | 7/1989 | European Pat. Off. . |
| 1184861 | 7/1989 | Japan . |
| 1184942 | 7/1989 | Japan . |
| 1199404 | 8/1989 | Japan . |
| 2181298 | 4/1987 | United Kingdom . |

OTHER PUBLICATIONS

Mickanin et al., "LWT Resistor Design and Circuit Considerations for Precision Components", Tektronix, Inc. pp. 231–217.

Primary Examiner—Andrew J. James
Assistant Examiner—Cynthia S. Deal
Attorney, Agent, or Firm—Finnegan, Henderson, Farabow, Garrett, and Dunner

[57] ABSTRACT

A trimming resistor element includes a high-resistance film of high resistivity formed on an insulation film on the main surface of a substrate, and a low-resistance region which is formed by selectively subjecting the high-resistance film to a predetermined process so as to lower the resistivity thereof. A resultant resistance of the low-resistance region and the high-resistance film can be adjusted by selectively cutting off part of the low-resistance region.

13 Claims, 4 Drawing Sheets

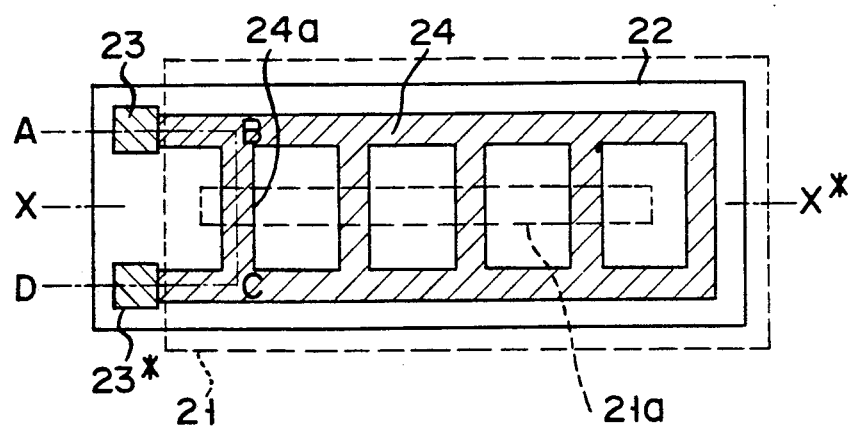
F I G. 1
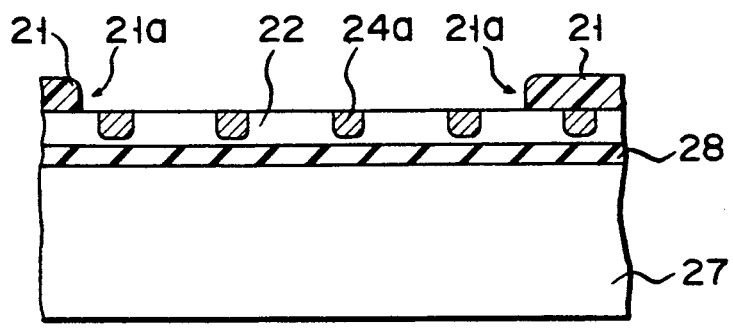
F I G. 2
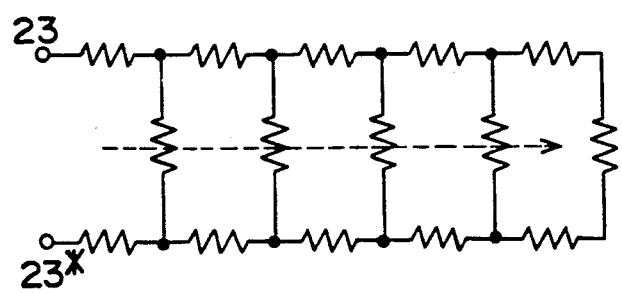
F I G. 3

TRIMMING RESISTOR ELEMENT FOR MICROELECTRONIC CIRCUIT

BACKGROUND OF THE INVENTION

1. Field of the Invention

This invention relates to a trimming resistor element for use in a microelectronic circuit such as a thin film or a thick film integrated circuit, and more particularly to a trimming resistor element used for effecting functional trimming by use of a laser beam.

2. Description of the Related Art

Recently, in semiconductor integrated circuits and hybrid integrated circuits, functional trimming has received attention as a means of achieving highly precise output characteristics.

Since light is used for trimming by the laser beam, the trimming may be effected on an object to be trimmed which is electrically separated from the trimming device. For example, when a resistor is used as an element for determining the output characteristic of a circuit, the resistance thereof is previously set to a roughly determined initial value. First, the circuit is set into an operative condition before starting the adjustment of the resistance. Then, the resistance is adjusted by partially cutting off or processing the resistor element by application of a laser beam until a desired output characteristic is obtained, while the output characteristic of the circuit is observed. In this way, a highly precise output characteristic can be attained. This method is called functional trimming.

In general, the method of adjusting the resistance of a resistor element by use of functional trimming is divided into two methods as shown in FIGS. 5 and 6.

The method shown in FIG. 5 is effected by forming a groove or grooves in the trimming resistor element in order to adjust its resistance. In FIG. 5, reference numerals 1 and 1* denote electrodes and reference numeral 2 denotes a resistor film. When groove 3 is formed in the direction indicated by the arrow by a laser beam, the density and direction of electric forces between electrodes 1 and 1* change and as a result change the resistance between electrodes 1 and 1* (Refer to Wes Mickanin et al., "LWT RESISTOR DESIGN AND CIRCUIT CONSTRUCTIONS FOR PRECISION COMPONENTS" pp. 213-217, Tektronix Inc.).

The other method, shown in FIG. 6, is effected by cutting off at least part of a resistor network. In FIG. 6, an example of a trimming resistor element in which the resistor network is formed in a lattice configuration is shown. As resistor films 4a, connected in parallel with resistor film 4, are sequentially cut off by a laser beam, the resultant resistance, as viewed from electrodes 3 and 3*, changes. Like the case shown in FIG. 5, the density and direction of electric forces between electrodes 3 and 3* change. In this case, the resistance is adjusted by actually and selectively removing parallel-connected resistor films 4a from the resistor network.

The method of FIG. 5 in which the resistance is adjusted by forming a groove in the resistor film is a widely used method. However, the method has a serious problem in that the resistor is subject to aging, that is, the resistance thereof varies with time. It is well known in the art that a minute crack (which is hereinafter referred to as a microcrack) 3a is formed in the cut-away portion when a groove is formed by the laser beam. The microcrack may become greater due to application of a thermal or mechanical stress which affects the resistance of the resistor after the resistor is completely manufactured. Further, if the microcrack absorbs moisture and the distribution of electric forces in the microcrack portion is changed by the moisture absorption, the resistance of the resistor is changed with time. In most circuits in which the resistance adjustment is effected by functional trimming to achieve highly precise output characteristics, aging of the resistance may become a fatal problem.

On the other hand, in the method of FIG. 6, in which the circuit network is partially cut off, the cut-off resistor is substantially removed from the circuit network so that no current will flow through the parallel cut-off resistor film. Therefore, even if a microcrack occurs in the cut-off portion, the resistance of the trimming resistor will not subject to aging. However, the method has a different problem. The problem is explained with reference to FIG. 7.

FIG. 7A is a view of a trimming resistor network (trimming resistor element) as viewed from above, in the same manner shown in FIG. 6. Protection film 5 is generally formed on the trimming resistor element. When a laser beam is applied to the trimming resistor element through the protection film in order to selectively cut off parallel resistor films 4a, part of the laser beam is absorbed into the protection film. When this occurs, power necessary to achieve the cut-off operation is less-likely to be transmitted to the resistor element. Therefore, it is necessary to remove part of the protection film lying on the region to which the laser beam is applied. Thus opening 51 is made in the region.

FIG. 7B is a cross sectional view of part of opening 51 taken along line X—X* of FIG. 7A. Parallel resistor films 4a are formed on oxide film 8 of semiconductor substrate 7. When the protection film is partially removed, a corresponding portion of oxide film 8 lying under resistor film 4a is etched out and depressions are formed directly under resistor films 4a as shown by reference numeral 52.

If laser trimming is effected under this condition, the laser beam will be applied to the stepped portions of the oxide film immediately after the resistor films are melted away by application of the laser beam. As a result, the laser beam is refracted or diffracted by the stepped portions of the oxide film so that the laser beam may be locally focused on some regions, thereby causing silicon substrate 7 to be damaged.

Further, another problem is that an etchant, for etching the protection film or patterning electrodes, remains on the depressions 52 and makes it difficult to provide highly reliable products.

That prior art method of, shown in FIG. 5, forming a groove which is included in the conventional methods of adjusting the resistance of the resistor has a problem in that a microcrack occurs in the current path of the resistor film, causing the resistance thereof to vary with time. Further the prior art method, shown in FIG. 6 of selectively cutting off the resistor network has problems in that the reliability may be degraded by the damage caused in the substrate in the cut-off operation, and a residue of etchant used for removing the protection film may remain on the oxide film.

SUMMARY OF THE INVENTION

An object of the present invention is to provide a trimming resistor element for a microelectronic circuit free from the conventional problems such as the resistance being subject to aging due to a microcrack and the reliability being degraded by damage to the substrate and residue of the etchant.

The trimming resistor element of the present invention comprises a high-resistance film of high resistivity formed on an insulation film which is formed on the main surface of a substrate; and a low-resistance region formed by effecting a predetermined process (such as an impurity doping process or light exposing process) with respect to a region corresponding to a resistor network pattern of the high-resistance film; wherein the resultant resistance is adjusted by selectively cutting off the low-resistance region.

The resultant resistance of the trimming resistor element of the present invention is mainly determined by the low-resistance region (for example, low-resistance region pattern 24 in FIG. 1). Further, the resultant resistance can be adjusted by partially cutting off the low-resistance region by use of a laser beam. A low-resistance region pattern is formed on that portion of the low-resistance region which lies around the cut-off portion so as to prevent a current from flowing therein after the cut-off operation. Therefore, even if a microcrack has occurred in the cut-off portion, the resultant resistance obtained after the cut-off operation will not be affected by the microcrack, thereby preventing the resultant resistance from being subject to aging.

With the construction of the trimming resistor element of the present invention, in order to sequentially cut off parts of the low-resistance region, it is desirable to directly apply the laser beam to a portion to be cut off. For this purpose, that part of the protection film which lies on the to-be-cut-off portion is removed to form an opening which permits the laser beam to pass. In this case, a portion of the protection film to be removed is limited to that portion of the protection film which lies on the high-resistance film including the low-resistance region. Therefore, a stepped portion or depression which is formed in the insulation film lying directly under the low-resistance region in the conventional method will not occur in the present invention. In this way, the problems of the conventional method caused by the damage to the silicon substrate and residue of the etchant can be avoided.

BRIEF DESCRIPTION OF THE DRAWINGS

FIG. 1 is a plan view showing the construction of a trimming resistor element according to one embodiment of the present invention;

FIG. 2 is a cross sectional view taken along line X—X* of FIG. 1;

FIG. 3 is a circuit diagram of an equivalent circuit of the trimming resistor element shown in FIG. 1;

DETAILED DESCRIPTION OF THE PREFERRED EMBODIMENTS

Figure 4A:
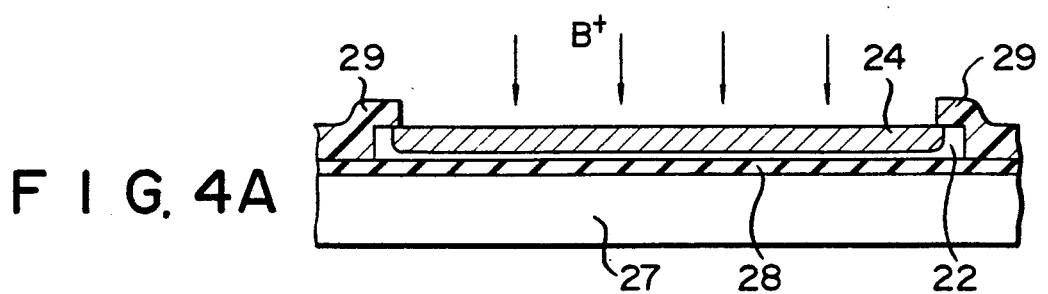
FIGS. 4A to 4D are cross sectional diagrams showing the process of manufacturing the trimming resistor element shown in FIGS. 1 and 2 in the order of the manufacturing steps, FIG. 4A showing a step of forming low-resistance region 24 in an active region of substrate 27, FIG. 4B showing a step of etching CVD film 30 on low-resistance regions 24a, FIG. 4C showing a step of forming electrode 23 in and around an opening in low-resistance regions 24a, and FIG. 4D showing a step of etching part of protection film 21 in low-resistance regions 24a to form opening 21a for laser beam application.

A trimming resistor element in which polysilicon is used for a resistor film is explained as an embodiment of a trimming resistor element of the present invention.

FIG. 1 is a plan view of a model of the above trimming resistor element including a protection film. FIG. 2 is a cross sectional view taken along line X—X*. As shown in FIGS. 1 and 2, insulation film (oxide film) 28 is formed on the main surface of semiconductor substrate 27 and a high-resistance film of high resistivity or high-resistance film 22 formed of polysilicon containing no impurities is formed on oxide film 28. Boron (B) is selectively doped into part of high-resistance film 22. That is, a lattice pattern region is formed to reduce the resistance of the corresponding region, thus forming low-resistance region 24.

The trimming resistor element is formed of high-resistance film 22 and low-resistance region 24, and the resultant resistance thereof or the resistance between electrodes 23 and 23* can be adjusted by sequentially cutting off parallel-connected low-resistance regions 24a of low-resistance region 24.

Protection film 21 is shown as the area surrounded by broken lines in FIG. 1 and is formed on high-resistance film 22 and low-resistance region 24. However, it is preferable to directly apply a laser beam to the to-be-cut-off portion of parallel-connected resistor regions 24a to be cut off by application of the laser beam. For this purpose, a corresponding portion of the protection film is removed to form opening 21a.

FIGS. 4A to 4D are cross sectional views taken along broken lines A-B-C-D (refer to FIG. 1) to illustrate the schematic manufacturing process of the trimming resistor element, and the protection film shown in FIG. 1.

As shown in FIG. 4A, semiconductor substrate 27 having an impurity diffused, for example, into an active region such as a transistor region, and oxide film 28, formed on the main surface thereof, is first prepared. Then, polysilicon film 22 of high resistivity containing no impurity is formed on oxide film 28 by deposition by a CVD method to a thickness of less than 1 μm, for example, 0.45 μm. After this, the photoresist technique is used to selectively dope boron (B+) by ion-implantation into high-resistance film 22 with resist 29 used as a mask and then diffuse the ion-implanted boron to form lattice low-resistance region 24 of a desired low resistivity. In this example, the diffusion depth of the impurity (boron) is such that the low-resistance region does not reach oxide film 28 in FIG. 4A, but it is possible to set the depth such that the low-resistance region may reach oxide film 28.

In this embodiment, the width of low-resistance region 24 in a direction along the main surface of the substrate is set at approx. 10 μm and the sheet resistance thereof is set to 100 to 500 Ω/□. In a case where an impurity is doped into high-resistance film 22 via a chemical vapor deposition (CVD) film (boron silicate glass (BSG) film), an oxide film is first formed on high-resistance film 22 including the low-resistance region and then impurity is doped with the oxide film kept left on the high-resistance region.

Figure 4B:
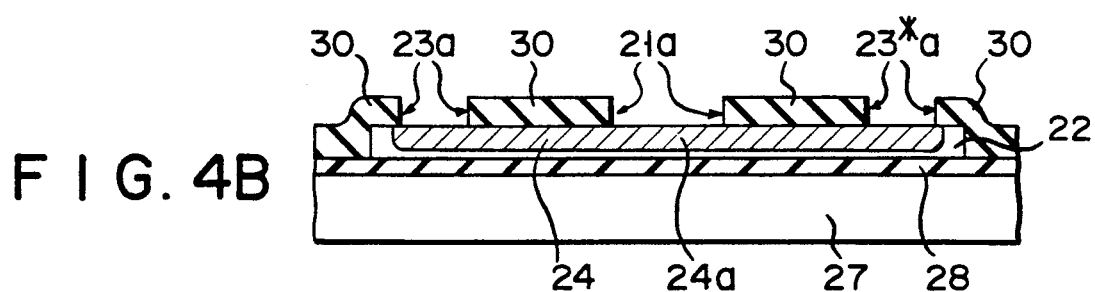

Next, as shown in FIG. 4B, CVD film 30 of silicon oxide is formed and is etched out by a photoetching process to form openings 23a and 23* for formation of electrodes and opening 21a for permitting the laser beam application.

Figure 4C:
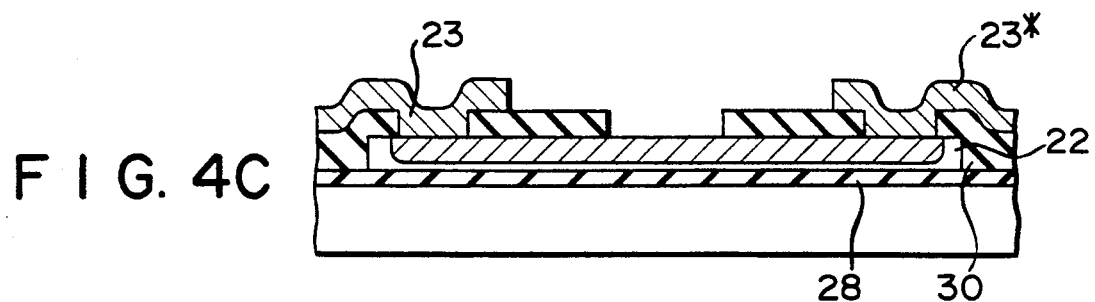

After this, as shown in FIG. 4C, Al for forming the electrode wiring is deposited and then electrodes 23 and 23* are formed by wet etching using the photoetching technique.

Figure 4D:
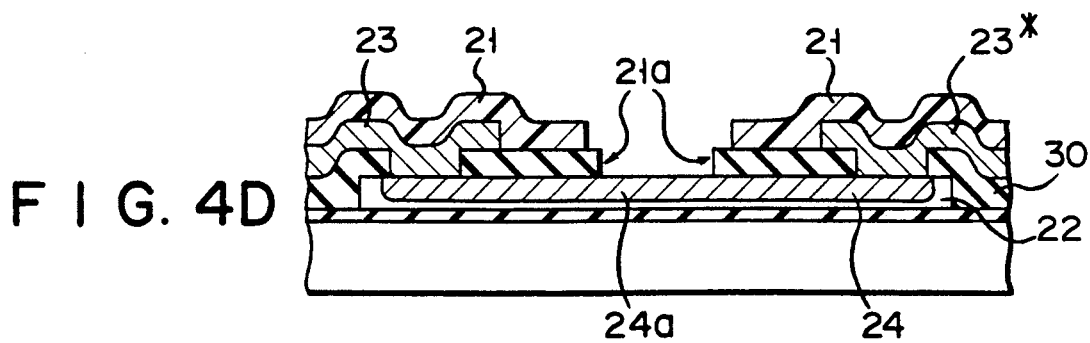

As shown in FIG. 4D, protection film (SiN film) 21 is formed by the CVD method and is then selectively etched out to form opening 21a for permitting the laser beam application.

With the trimming resistor element formed in the above-described manner, the resistivity of high-resistance film 22 formed of polysilicon containing no impurities is extremely high. Therefore, the effective resultant resistance between electrodes 23 and 23* is substantially determined by the resistivity and pattern shape of low-resistance region 24 having an impurity doped therein and a resistor circuit between electrodes 23 and 23* can be equivalently expressed by a resistor network of FIG. 3. In FIG. 3, an arrow indicates a direction of the laser trimming.

Figure 5:
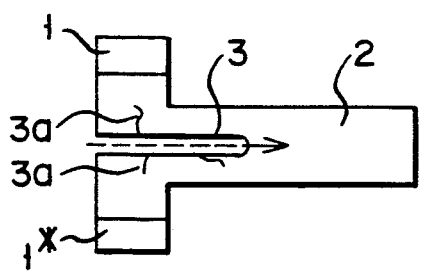
FIG. 5 is a plan view illustrating the conventional method for changing the resistance of a trimming resistance element by forming groove 3 in the trimming resistance element.
Figure 6:
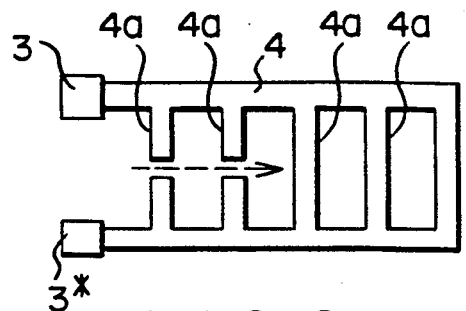
FIG. 6 is a plan view illustrating the conventional method for changing the resistance of a trimming resistance element constituting a lattice resistor network, by cutting off part of the network of the trimming resistor element.

In the trimming resistor element (FIGS. 1 and 4D), the resultant resistance thereof between electrodes 23 and 23* can be adjusted by selectively cutting off region 24a by directly applying a laser beam to those portions of parallel-connected low-resistance regions 24a which are exposed to opening 21a. Even if microcracks shown by 3a in FIG. 5 occur in the cut-off portion of parallel-connected low-resistance regions 24a, the microcrack will not affect the resultant resistance of the trimming resistor element after the cut-off of region 24a. This is because region 24a is released from the trimming resistor element network. As a result, aging of the resistor due to the growth of the microcrack can be prevented.

Figure 7A:
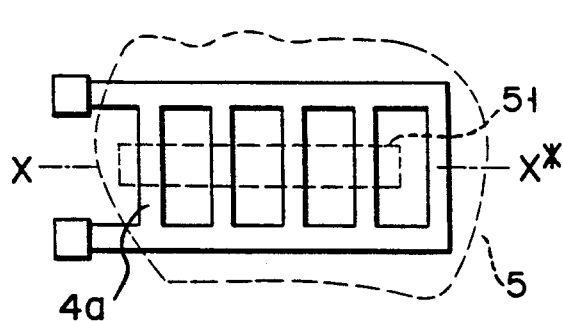
FIG. 7A is a top plan view of a resistor network trimming resistor element covered with protection film 5 having opening 51 formed in a position to which the laser beam is applied.
Figure 7B:
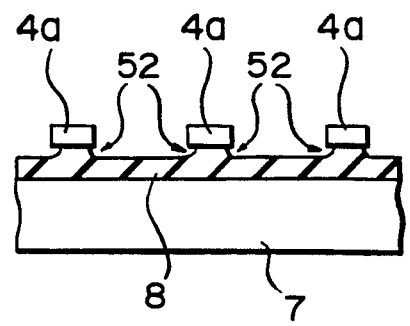
FIG. 7B is a partially cross sectional view taken along line X—X* of FIG. 7A; .

With the trimming resistor element of the above construction, the low-resistance film is formed in the high-resistance film of polysilicon containing no impurities. That is, if it is required to remove the Al film or protection film in order to form opening 21a after formation of the Al film or protection film (SiN film or the like), all the portion of the film to be removed is formed on the silicon resistor film. Therefore, a depression (52) of the oxide film directly under parallel-connected low-resistance film 24 which has occurred in the conventional method (FIG. 7B), as described before, will not occur in this embodiment. In this way, the conventional problem that the reliability is degraded by the residue of etchant and damage to the silicon substrate by the laser beam applied to the stepped portion of the depression when low-resistance region 24 is cut off by application of the laser beam, can be solved.

Figure 8:
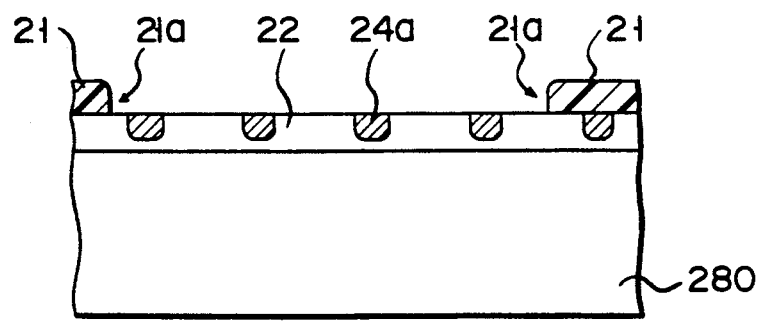
FIG. 8 is a modification of the view shown in FIG. 2.

In the embodiment of FIG. 2, the trimming resistor element is formed on the oxide film of the semiconductor substrate. As shown in FIG. 8, the trimming resistor element may be formed on insulation film 280 of ceramic, for example.

If the resistivity of the high-resistance film is approx. 1000 times (approx. 100 k to 500 kΩ/□) higher than that of the low-resistance region, it is not necessary to use a polysilicon film containing no impurities as high-resistance film 22. In a case where a current flowing in the trimming resistor element after the cut-off operation is not substantially affected by the growth of the microcrack, it is possible to set the ratio of the resistivity of the high-resistance film to that of the low-resistance film to less than 1000, for example, 100 to 1000.

Figure 9A:
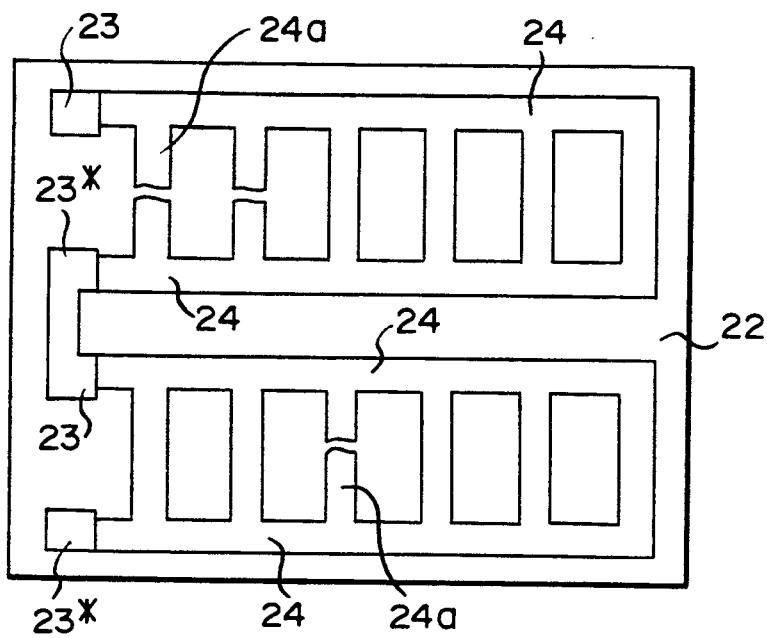
FIGS. 9A and 9B are modifications of the trimming resistor element pattern of FIG. 1.
Figure 9B:
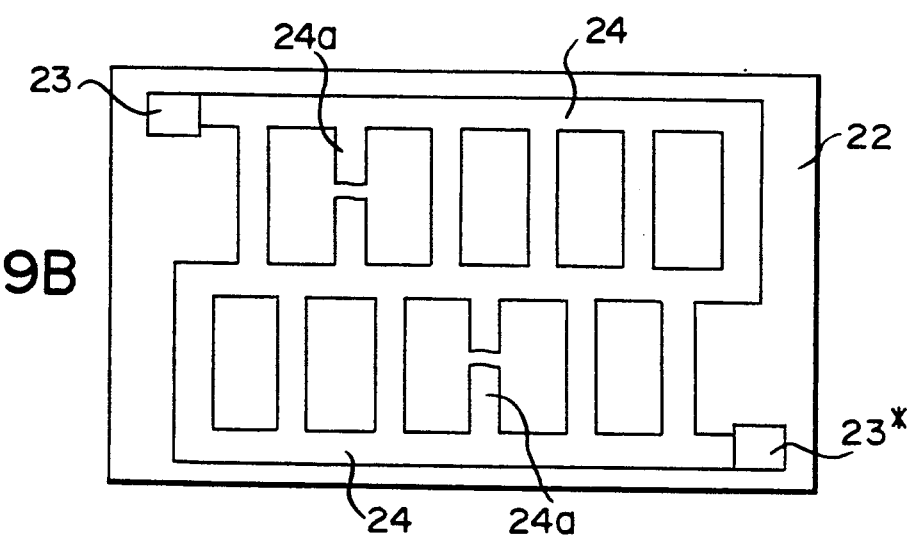
Figure 10:
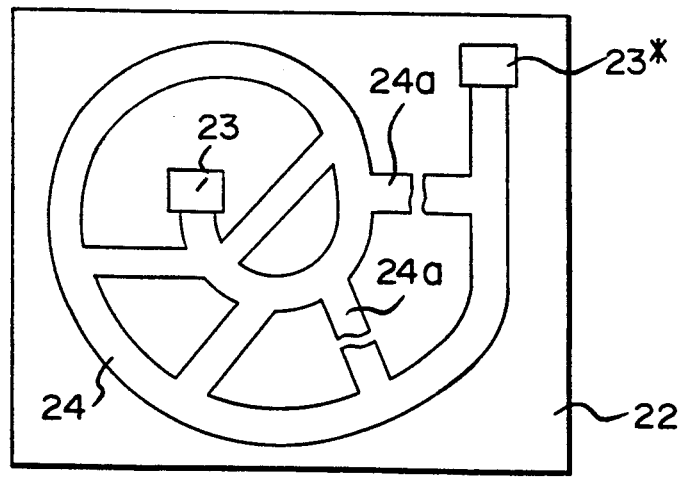
FIG. 10 is another modification of the trimming resistor element pattern of FIG. 1.

In the embodiment of FIGS. 1 to 4, the low-resistance network of the trimming resistor element is formed in the lattice configuration. For example, a network formed by series-connecting a plurality of parallel-connected resistor circuits including trimming resistor films as shown in FIG. 9A or 9B, or a resistor network formed in another configuration as shown in FIG. 10 can be utilized in this invention.

Further, in the above embodiment, an impurity is selectively doped into the polysilicon film of high resistance to lower the resistivity of the doped region, thus forming the low-resistance region. The present invention is not limited to this method of forming the low-resistance region. For example, it is possible to selectively illuminate the high-resistance film to lower the resistivity of the illuminated portion so as to form a low-resistance region.

As described above, in the trimming resistor element of the present invention, since the low-resistance region is formed in the high-resistance film, no depression will be formed in the insulation film directly under the low-resistance region at the opening when an opening is formed in the protection film. As a result, the problem that the reliability is degraded by damage to the underground substrate and the residue of etchant in the prior art can be solved. Further, since the resultant resistance of the trimming resistor element of the present invention is adjusted by cutting off the low-resistance region which does not constitute a current path after the cut-off operation, the resultant resistance after the cut-off operation is not affected even if a microcrack occurs and grows in the cut portion. Therefore, the resultant resistance is not subject to aging.

U.S. patent applications which disclose the technology of the present invention are as follows:

(1) U.S. Ser. No. 298,131 filed on Jan. 18, 1989 "Trimming Element for Microelectronic Circuit", and (2) U.S. Ser. No. 305,811 filed on Feb. 3, 1989 "Trimming Resistor Network".

The inventor of this application is one of the inventors of the above two applications. All the disclosure of the above two applications is incorporated into the specification of this application.

What is claimed is:

1. A trimming resistor element comprising:
   a substrate having an electrically insulative main surface;
   a high-resistance film of a first resistivity formed on the main surface of said substrate; and
   a low-resistance region formed in said high-resistance film and having a second resistivity, lower than the first resistivity, which is cut off in order to trim the resistance of said trimming resistor element.

2. The trimming resistor element according to claim 1, wherein said low-resistance region includes two opposed portions formed in said high-resistance film; and at least one resistor bridge element is formed to connect the two opposed portions of the low-resistance region with a portion trimmed to obtain the second resistivity.

3. The trimming resistor element according to claim 2, wherein a protection film is formed over said high-resistance film.

4. The trimming resistor element according to claim 3, wherein said resistor bridge element has said portion trimmed by means of a laser beam, to obtain the second resistivity.

5. The trimming resistor element according to claim 2, wherein said high-resistance film includes polysilicon and said low-resistance region and said resistor bridge element are formed in said polysilicon high-resistance film.

6. The trimming resistor element according to claim 1, wherein said high-resistance film includes polysilicon and said low-resistance region is formed in said polysilicon high-resistance film.

7. The trimming resistor element according to claim 6, wherein a protection film is also formed on said low-resistance region.

8. The trimming resistor element according to claim 1, wherein said substrate includes a semiconductor substrate having a main surface on which an insulation film is coated.

9. The trimming resistor element according to claim 1, wherein said substrate includes a ceramic substrate.

10. The trimming resistor element according to claim 2, wherein said first resistivity is greater than 100 times said second resistivity.

11. The trimming resistor element according to claim 2, wherein said low-resistance region and said resistor bridge element are formed in a lattice pattern when viewed from the main surface of said substrate.

12. The trimming resistor element according to claim 2, wherein said low-resistance region and said resistor bridge element are formed in a spiral pattern when viewed from the main surface of said substrate.

13. A trimming resistor element comprising:
a substrate;
a high-resistance film formed on an insulation film on a main surface of said substrate; and
a low-resistance region including two opposed portions formed in said high-resistance film, and having at least one resistor bridge element which is provided between the two opposed portions which is cut to trim the resistance of the trimming resistor element.

* * * * *